(12) United States Patent
Maeyama

(10) Patent No.: US 8,681,488 B2
(45) Date of Patent: Mar. 25, 2014

(54) DISPLAY DEVICE

(75) Inventor: Tomohiro Maeyama, Kanagawa (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 112 days.

(21) Appl. No.: 13/528,370

(22) Filed: Jun. 20, 2012

(65) Prior Publication Data

US 2012/0327617 A1 Dec. 27, 2012

(30) Foreign Application Priority Data

Jun. 21, 2011 (JP) .................................. 2011-137010

(51) Int. Cl.
*G06F 1/16* (2006.01)
*H05K 5/00* (2006.01)
*G02F 1/1333* (2006.01)

(52) U.S. Cl.
USPC ................... 361/679.21; 361/679.01; 349/58; 349/60

(58) Field of Classification Search
USPC ............ 361/679.01–679.45, 679.55–679.59, 361/807, 810; 349/58–60; 312/223.1, 223.2
See application file for complete search history.

(56) References Cited

U.S. PATENT DOCUMENTS

| | | | | |
|---|---|---|---|---|
| 7,710,714 B2 * | 5/2010 | Rapp et al. | ............... | 361/679.01 |
| 8,054,400 B2 * | 11/2011 | Tsubokura et al. | ............. | 349/58 |
| 8,384,843 B2 * | 2/2013 | Tsubokura | ........................ | 349/60 |
| 2007/0188675 A1 * | 8/2007 | Tsubokura et al. | ............. | 349/58 |
| 2008/0094786 A1 * | 4/2008 | Liou et al. | ...................... | 361/679 |
| 2010/0246157 A1 * | 9/2010 | Kurahashi et al. | ............ | 361/829 |
| 2011/0110022 A1 * | 5/2011 | Kumagai et al. | ......... | 361/679.01 |

FOREIGN PATENT DOCUMENTS

| | | |
|---|---|---|
| JP | 2007-212652 | 8/2007 |
| JP | 2009-282216 | 12/2009 |
| JP | 2010-237464 | 10/2010 |

* cited by examiner

*Primary Examiner* — Jayprakash N Gandhi
*Assistant Examiner* — Nidhi Desai
(74) *Attorney, Agent, or Firm* — Hamre, Schumann, Mueller & Larson, P.C.

(57) ABSTRACT

Water running on a flat cable (66), which connects together a control circuit board (56) provided on a rear surface of a liquid crystal module (52) and a source driver board (60) arranged on a lower surface of the liquid crystal module, is prevented from entering the source driver board (60). A source driver board (60) is arranged on a lower surface of a mold frame (62) supporting a lower edge of a liquid crystal module (52). A flat cable (66) passes through a gap between a board cover (58) and a rear end surface (114) of the mold frame (62). A water absorbing member (110) adhered to the rear end surface (114) is applied to the flat cable (66).

5 Claims, 6 Drawing Sheets

DISPLAY DEVICE

CROSS-REFERENCE TO RELATED APPLICATION

The present application claims priority from Japanese application JP 2011-137010 filed on Jun. 21, 2011, the content of which is hereby incorporated by reference into this application.

BACKGROUND OF THE INVENTION

1. Field of the Invention

The present invention relates to a display device including a display panel, such as a liquid crystal television set.

2. Description of the Related Art

In recent years, a so-called flat panel display device such as a liquid crystal display has been widely utilized for various applications such as a television set and various types of monitors. This display device is generally not airtight. Therefore, for example, when a display panel surface of the display device is wiped with a damp cloth, or the display device is placed in a humid environment, water or moisture may enter inside a housing. When the entered water or the water droplets generated by condensation adhere to a circuit board provided inside the housing, failure such as short-circuiting may be caused.

Japanese Patent Application Laid-open No. 2007-212652 discloses a display device in which, in order to prevent water from entering inside a display module through a gap between the display panel and the housing when the display panel surface is wiped with a damp cloth or the like, a water absorbing member is adhered to a member which is opposed to the display panel at a position of the gap.

FIG. 9 is a schematic sectional view of lower part of a conventional liquid crystal display device. A liquid crystal panel 2, a light guide plate 4 arranged on a rear surface of the liquid crystal panel 2, a lower metal frame 8, and the like form a panel-like structure 10. An outer edge of the panel-like structure 10 is supported by a mold frame 12 (frame member). Onto a rear surface of the lower metal frame 8, a control circuit board 14 is mounted, and onto a lower surface of a lower-side portion of the mold frame 12, a source driver board 20 is mounted. The control circuit board 14 and the source driver board 20 are connected to each other by a flat cable 22. A connector 24 at an end portion of the flat cable 22 is inserted into a connector 26 of the source driver board 20. The control circuit board 14, the source driver board 20, and the flat cable 22 are covered with a cover 28 (shielding plate) made of a metal from behind.

SUMMARY OF THE INVENTION

Under a high humidity environment, water droplets may adhere to the respective members inside the display device. In particular, water droplets adhered to the flat cable 22 run downward along the surface of the cable, and pass a bent portion 30, at which the flat cable 22 changes its direction to a horizontal direction toward the source driver board 20, thereby expanding toward the source driver board 20 on the surface of the flat cable 22. Then, due to the capillary action, the water infiltrates a gap between the mold frame 12 and the flat cable 22 or a gap at a bonding portion of the connectors 24 and 26 to reach the source driver board 20. The inventors of the present invention have found out that, in some cases, in the display device including the flat cable 22 vertically extended between the control circuit board 14 and the source driver board 20 as described above, water droplets adhere to the surface of the flat cable 22, and the water droplets are guided to the source driver board 20 by the flat cable 22, which may cause a problem that, due to the water droplets, an electronic circuit of the source driver board 20 may be short-circuited to cause failure.

The present invention has been made to solve the above-mentioned problem, and has an object to provide a display device capable of preventing failure of a circuit board arranged on a lower surface of a frame member, which is caused by water droplets running down on an electric cable.

According to an exemplary embodiment of the present invention, there is provided a display device, including: a panel-like structure including a display panel; a lower edge support member for supporting a lower edge of the panel-like structure; a first circuit board arranged on a rear surface of the panel-like structure; a second circuit board arranged on a lower surface of the lower edge support member; an electric cable, which passes through a rear side of the lower edge support member, for connecting the first circuit board and the second circuit board to each other; a shielding plate for covering the first circuit board, the second circuit board, and the electric cable from behind; and a water absorbing member which is sandwiched between the lower edge support member and the shielding plate together with the electric cable and is applied to the electric cable.

According to the exemplary embodiment of the present invention, in the display device described above, it is preferred that the electric cable be a flat cable, and the water absorbing member be adhered to a rear end surface of the lower edge support member across an entire width of a part of the rear end surface opposed to the flat cable.

According to the exemplary embodiment of the present invention, in the display device described above, the flat cable may include a bent portion between a part extending vertically toward the first circuit board and a part extending horizontally toward the second circuit board. The bent portion may include a groove portion recessed below a height of a connection portion with respect to the second circuit board. Further, the groove portion may be formed across an entire width of the flat cable, and inclined so as to be lowered toward a side edge of the flat cable.

According to the exemplary embodiment of the present invention, in the display device described above, another of the water absorbing member may be adhered to the shielding plate so as to be opposed to an entire width of the flat cable.

According to the exemplary embodiment of the present invention, it is preferred that the water absorbing member include non-woven fabric.

DETAILED DESCRIPTION OF THE INVENTION

Figure 1:
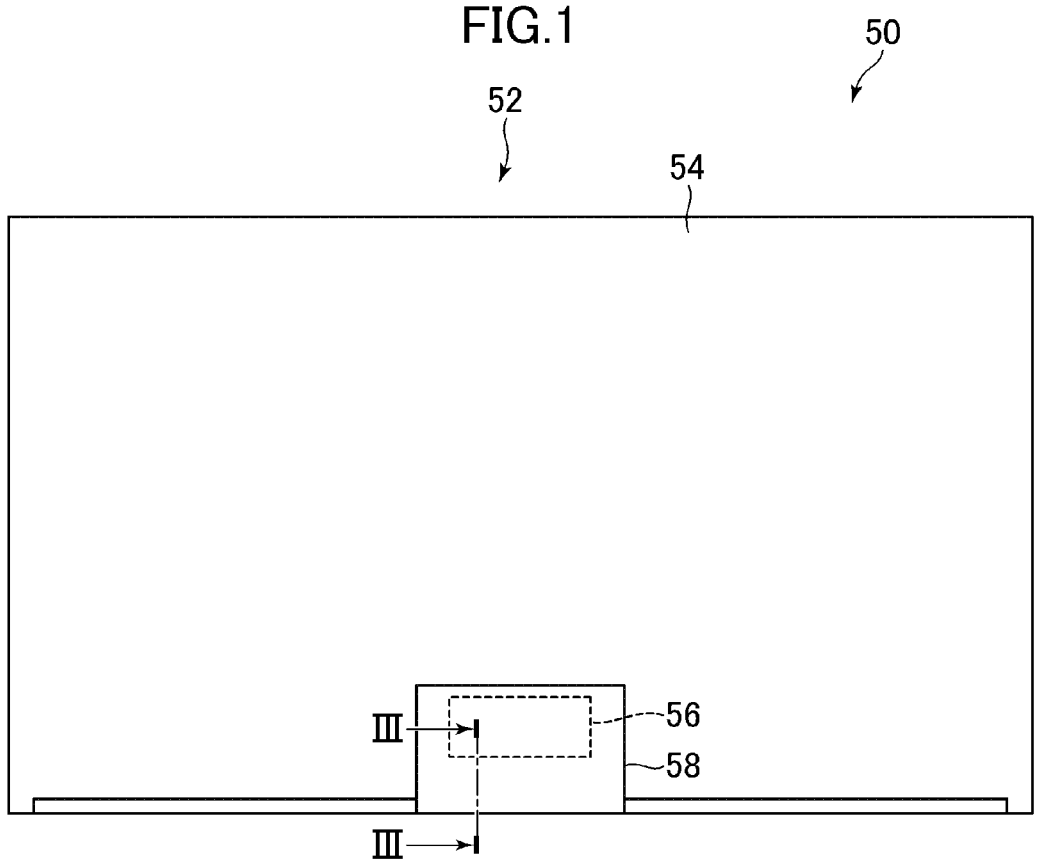
FIG. 1 is a schematic rear view of a liquid crystal module in a liquid crystal display device according to an embodiment of the present invention.

Hereinafter, a liquid crystal display device 50, which is a mode for carrying out the present invention (hereinafter, referred to as embodiment), is described with reference to the drawings. The liquid crystal display device 50 includes a liquid crystal module, an exterior covering and a stand. FIG. 1 is a schematic rear view of a liquid crystal module 52, and the liquid crystal module 52 has a substantially rectangular planar shape corresponding to a liquid crystal panel. The liquid crystal module 52 has a structure in which a frame member supports a panel-like structure obtained by combining parts such as the liquid crystal panel and a backlight unit. In this embodiment, a rear surface of the liquid crystal module 52 is basically covered with a lower metal frame 54 which is one member forming the frame member, and a mold frame for supporting an edge of the liquid crystal module 52 is provided on an outer periphery of the liquid crystal module 52. The liquid crystal module 52 includes a control circuit board 56 mounted onto a rear surface of the lower metal frame 54, a source driver board which is mounted onto a lower surface of a lower-side part (lower edge support member) of the mold frame and connected to the control circuit board 56 via a connector cable, and a board cover 58 (shielding plate) for covering rear surfaces of those members such as the control circuit board 56.

The liquid crystal panel includes a plurality of pixels arranged in matrix. In accordance with the arrangement of the pixels, on the liquid crystal panel, a plurality of source signal lines (data signal lines), which extend in a vertical direction (column direction), are arranged in a horizontal direction (row direction), and a plurality of gate signal lines (scanning signal lines), which extend in the horizontal direction, are arranged in the vertical direction. The liquid crystal module 52 includes a source driver circuit for driving the respective source signal lines, and a gate driver circuit for driving the respective gate signal lines. A control circuit provided to the control circuit board 56 controls operations of the source driver circuit and the gate driver circuit based on a video signal to be input. Specifically, each of the gate signal lines is connected to a plurality of pixel circuits arranged in the horizontal direction, and the gate driver circuit outputs gate signals to the plurality of gate signal lines in order, to thereby enable data writing of the pixel circuits connected to the gate signal lines. Further, each of the source signal lines are connected to a plurality of pixel circuits arranged in the vertical direction. The source driver circuit generates, from image data corresponding to one scanning line, signals corresponding to the respective plurality of pixels forming the scanning line and outputs the generated signals to the plurality of source signal lines. Pixel signals output to the respective source signal lines are written into pixel circuits which have been enabled to be written by a gate signal, and thus an amount of light to be output from the pixel is controlled based on the pixel signal written to each of the pixel circuits.

Figure 2:
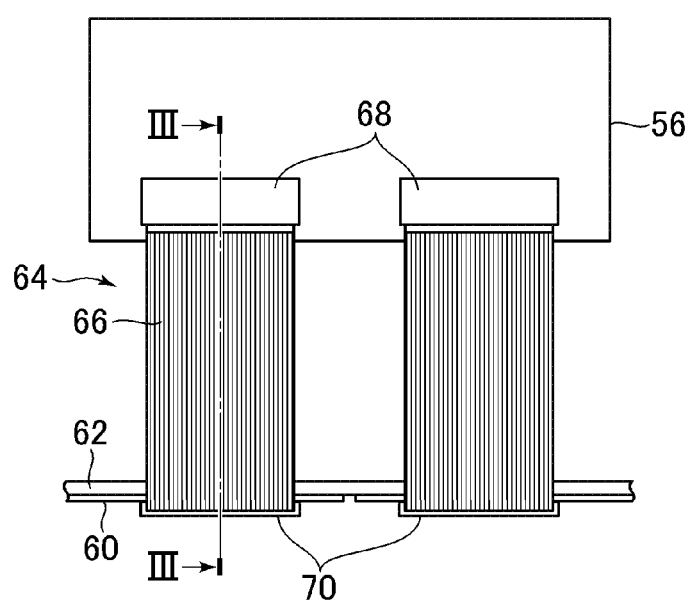
FIG. 2 is a schematic partial rear view of the liquid crystal module having a board cover removed.

FIG. 2 is a schematic partial rear view of the liquid crystal module 52 having the board cover 58 removed, and illustrates a part to be covered with the board cover 58. The source driver board 60 extends, for example, in the horizontal direction on the lower surface of the lower edge support member (hereinafter, simply referred to as mold frame 62), which is the lower-side part of the mold frame. The source driver circuit formed on the source driver board is connected to the respective source signal lines of the liquid crystal panel. The control circuit board 56 and the source driver board 60 are connected to each other via a connector cable 64. The connector cable 64 includes a flat cable 66 and connectors mounted onto both ends of the flat cable 66, and the connectors on both the ends are inserted into connectors 68 and 70 provided on the control circuit board 56 and the source driver board 60, respectively. By the way, in this embodiment, the connector 70 of the source driver board 60 is arranged at substantially a middle portion of the liquid crystal module 52 in the horizontal direction so that signals are transmitted uniformly as much as possible to the respective source signal lines arranged across the width of the liquid crystal panel. Further, in accordance therewith, the control circuit board 56 is arranged substantially immediately above the source driver board 60, that is, at substantially the middle portion of the liquid crystal module 52 in the horizontal direction. Further, the control circuit board 56 is arranged near the lower edge side of the liquid crystal module 52 so as to reduce a length of wiring with respect to the source driver board 60 arranged on the lower surface of the mold frame 62. Further, a gate driver board (not shown) on which the gate driver circuit is formed is arranged on both or one of right and left sides of the liquid crystal panel. For example, an end portion of the source driver board 60 is connected to the gate driver board so that signals can be transmitted from the control circuit board 56 to the gate driver board via the connector cable 64 and the source driver board 60.

Figure 3:
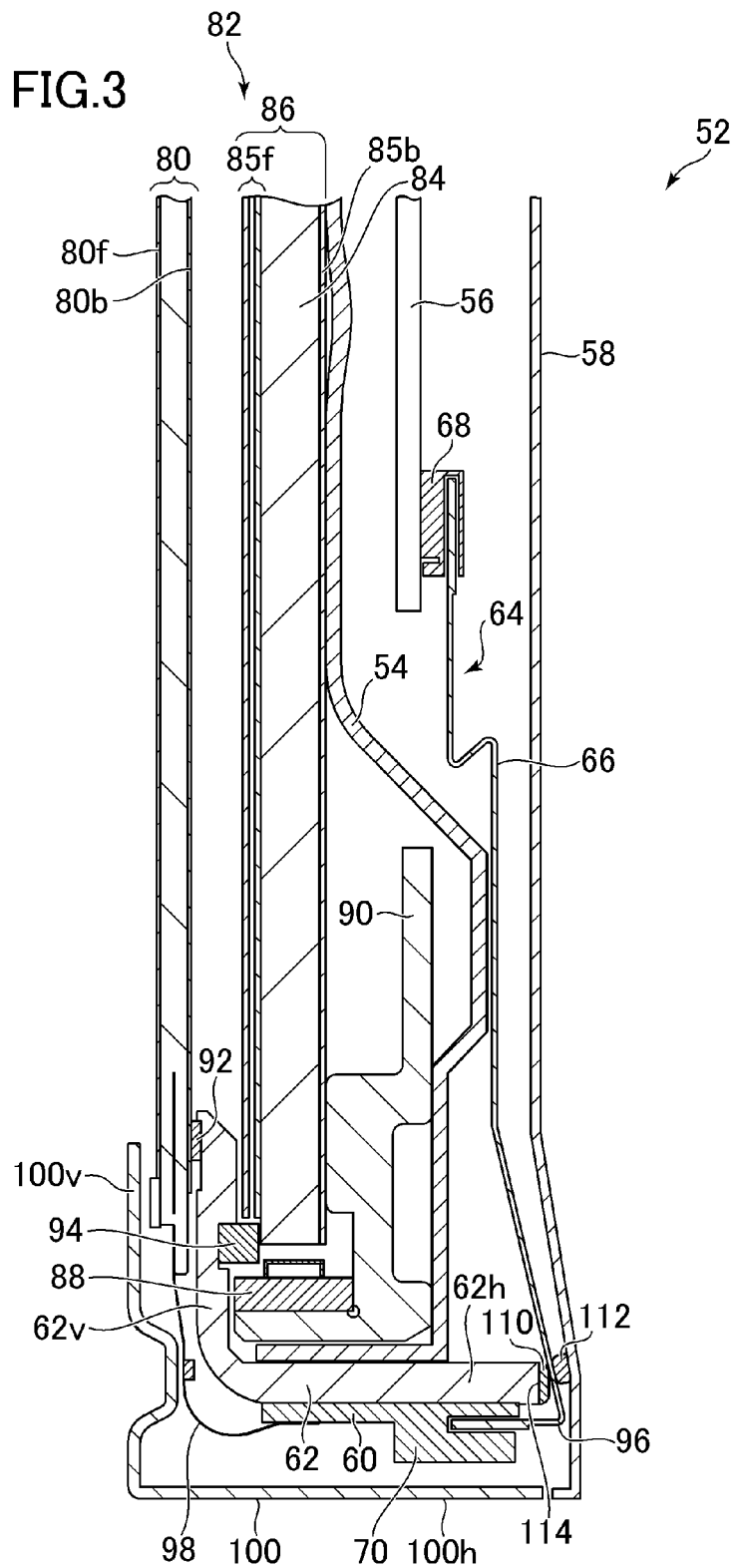
FIG. 3 is a schematic vertical sectional view of the liquid crystal module taken along the line III-III of FIGS. 1 and 2.

FIG. 3 is a schematic vertical sectional view of the liquid crystal module 52, and is a partial sectional view taken along the line III-III of FIGS. 1 and 2. The left side of FIG. 3 corresponds to the front surface side of the liquid crystal display device 50, that is, the display surface side, and the right side thereof corresponds to the rear surface side of the liquid crystal display device 50. On the front surface of the liquid crystal module 52, a liquid crystal panel 80 serving as the display panel is arranged. The liquid crystal panel 80 includes, although not shown in FIG. 3, a TFT (thin film transistor) substrate on a rear side thereof, a counter substrate on a front side thereof, and a liquid crystal layer sandwiched between those substrates. The liquid crystal panel 80 is a transmissive liquid crystal panel, and a lower polarizing plate 80b is arranged on the rear surface of the TFT substrate, and an upper polarizing plate 80f is arranged on the front surface of the counter substrate. A backlight unit 82 is arranged so as to be opposed to the rear surface of the liquid crystal panel 80.

The backlight unit 82 of the liquid crystal display device 50 employs an edge light system, and includes a layered body 86, a light source 88 for causing light to enter from a lateral surface of a light guide plate 84 forming a part of the layered body 86, and a radiator plate 90 for cooling the light source 88. The layered body 86 includes optical sheets 85f including a diffusion sheet, which are laminated on a front surface of the light guide plate 84, and a reflective sheet 85b arranged on a rear surface thereof. Further, for example, the light source 88 may include a light emitting diode (LED), and the light source 88 has a structure in which an optical element such as a lens is mounted on a substrate on which the LED is arranged.

The lower metal frame 54 is arranged on the rear surface of the backlight unit 82, and the control circuit board 56 is threadably mounted onto the lower metal frame 54 via a spacer, for example. Note that, onto the lower metal frame 54, in addition to the control circuit board 56, for example, a circuit board for a received signal processing circuit and the like is mounted, which is used in a case where the liquid crystal display device 50 is a television set. The lower metal frame 54 is bent at a lower edge thereof into an L-shape from the rear surface to the lower surface of the backlight unit 82.

The mold frame is formed by resin molding into an integrated frame along an outer periphery of the liquid crystal module 52. A part of the mold frame 62 illustrated in FIG. 3 is the lower-side part thereof. The mold frame 62 also has a cross-section of an L-shape, and includes a part 62h horizontal in the front-rear direction of the liquid crystal module 52, and a vertical part 62v extending upward from a front end of the horizontal part 62h. The horizontal part 62h supports a lower surface of a part of the lower metal frame 54, which is laid under the backlight unit 82. On the other hand, the vertical part 62v is inserted into a gap provided between the liquid crystal panel 80 and the backlight unit 82. A lower edge portion of the rear surface of the liquid crystal panel 80 and a lower edge portion of the front surface of the layered body 86 (light guide plate 84) touch the vertical part 62v via buffer members 92 and 94, respectively.

As described above, the control circuit board 56 and the source driver board 60 are connected to each other by the connector cable 64. One end of the connector cable 64 is inserted into the connector 68 mounted onto the control circuit board 56, and another end thereof is inserted horizontally into the connector 70 mounted onto the source driver board 60. In this case, the flat cable 66 is basically arranged in the up-down direction from the connector 68 to the lower end of the liquid crystal module 52 at which the source driver board 60 is positioned. However, at the lower end side of the liquid crystal module 52, the flat cable 66 needs to be bent in the horizontal direction in conformity to the direction of the connector 70. Specifically, a bent portion 96 of the flat cable 66 is formed below the horizontal part 62h of the mold frame 62.

Further, the source driver board 60 and the liquid crystal panel 80 are connected to each other by a flexible board 98.

An upper metal frame 100 is an integrated frame formed along the outer periphery of the liquid crystal module 52. The upper metal frame 100 has a cross-section of an L-shape at each side of the frame, and includes, for example, a part 100h horizontal in the front-rear direction of the liquid crystal module 52 at a lower-side part illustrated in FIG. 3, and a front surface part 100v extending upward from a front end of the horizontal portion 100h. Into the frame of the upper metal frame 100, the above-mentioned main part of the liquid crystal module 52 in which the liquid crystal panel 80, the backlight unit 82, the mold frame, and the like are assembled is fitted. An outer peripheral lateral surface of the liquid crystal module 52 is covered with the horizontal part 100h of the upper metal frame 100, and a front surface outer edge portion thereof is covered with the front surface part 100v. For example, at the lower edge of the liquid crystal module 52, the horizontal part 100h covers the lower surface of the source driver board 60. Further, the front surface part 100v covers and hides the end portion of the liquid crystal panel 80 and the flexible board 98.

Further, as described above, the board cover 58 covers and hides the control circuit board 56, the connector cable 64, and the source driver board 60 on the rear side of the liquid crystal module 52, thereby blocking radiation noises generated from those electronic circuits.

In the above-mentioned structure of the liquid crystal module 52, the flat cable 66 is wired between the control circuit board 56 and the source driver board 60 through a gap provided between the board cover 58 and a rear end of the horizontal part 62h of the mold frame 62. The liquid crystal display device 50 includes a water absorbing member which is sandwiched at this gap together with the flat cable 66 and is applied to the flat cable 66. Specifically, a water absorbing member 110 is adhered to a rear end surface of the mold frame 62 with use of, for example, a highly water resistant pressure-sensitive member or adhesive such as two-sided pressure-sensitive tape or glue. The water absorbing member 110 is applied to a front surface of the flat cable 66. With this, even when water droplets generated by, for example, condensation on the front surface of the flat cable 66 run downward along the front surface, the water absorbing member 110 absorbs the water droplets. Thus, the water droplets are prevented from flowing below the horizontal part 62h and diffusing in the horizontal direction from the bent portion 96 to enter the connector 70 of the source driver board 60. In this manner, the failure of the liquid crystal display device 50 to be caused by short-circuit at the source driver board 60 and the like is prevented.

Further, the liquid crystal display device 50 includes, on an inner surface of the board cover 58, a counter member 112 facing the rear end surface of the horizontal part 62h. The counter member 112 presses a rear surface side of the flat cable 66 to reliably bring the flat cable 66 into contact with the water absorbing member 110. The counter member 112 may be adhered to the board cover 58 by a method similar to that employed for the water absorbing member 110. It is preferred that the counter member 112 be made of a material having elasticity, and for example, a foamed or porous material, such as sponge, may be used.

Further, the counter member 112 may be a member having water-absorbing property as well. With this, water droplets running downward the rear surface of the flat cable 66 are absorbed by the counter member 112, and thus the water droplets are prevented from running from the bent portion 96 via a lower surface of the horizontal part of the flat cable 66 to enter the connector 70 of the source driver board 60. In this manner, failure of the liquid crystal display device 50 is prevented.

Note that, in this embodiment, the material of the water absorbing member 110 is non-woven fabric, but alternatively, other materials having higher elasticity may be used, such as foamed water absorbing material or water absorbing gel.

Figure 4:
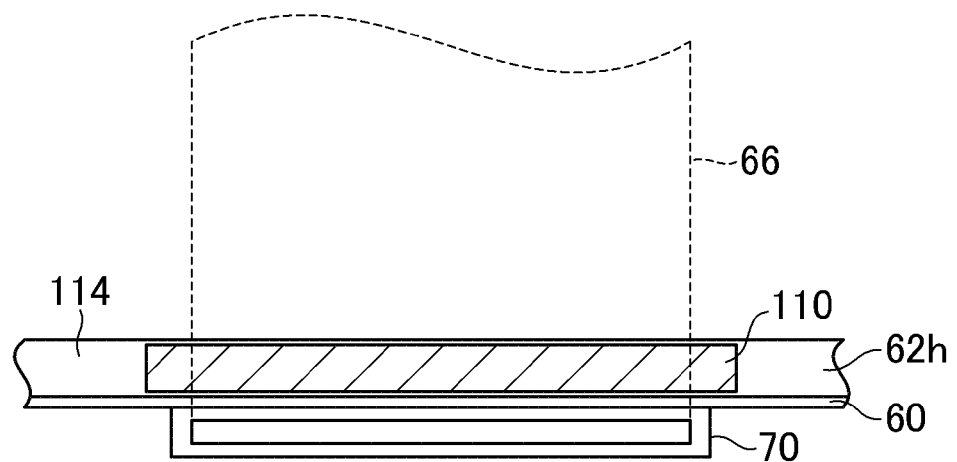
FIG. 4 is a schematic partial rear view of the liquid crystal module in the vicinity of a position at which a flat cable is arranged.

FIG. 4 is a partial rear view of the liquid crystal module 52, and is a view schematically illustrating the vicinity of the rear end surface of the mold frame 62 at a position at which the flat cable 66 is arranged. It is preferred that the water absorbing member 110 be arranged on a rear end surface 114 of the horizontal part 62h of the mold frame 62 so as to cover the entire width of a part thereof opposed to the flat cable 66. Further, from the viewpoint that the flat cable 66 is flexible and can be somewhat displaced laterally, and that the accuracy required for the adhering position of the water absorbing member 110 can be relaxed, it is preferred that a horizontal range in which the water absorbing member 110 is to be adhered is set larger than the width of the flat cable 66. Because the counter member 112 has a function of pressing the flat cable 66 against the water absorbing member 110 and absorbing the water droplets running on the rear surface side of the flat cable 66, the counter member 112 is arranged in a range similar to that of the water absorbing member 110.

Further, as another viewpoint, when the horizontal width of the water absorbing member 110 is increased, the area and volume of the water absorbing member 110 can be increased to increase the water absorbing capacity thereof. In this embodiment in which the counter member 112 bears a water absorbing function on the rear surface side of the flat cable 66, the counter member 112 may also have a horizontal width larger than a value necessary depending on the position and width of the flat cable 66, to thereby increase the water absorbing capacity thereof.

Figure 5:
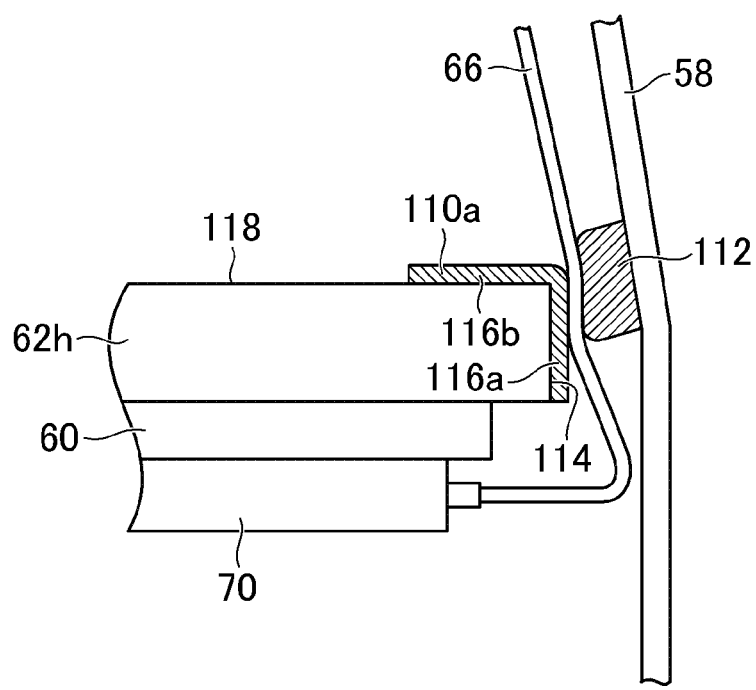
FIG. 5 is a schematic partial sectional view of the liquid crystal module, illustrating an example of a water absorbing member having a vertical sectional shape different from that of a water absorbing member in FIG. 3.
Figure 6:
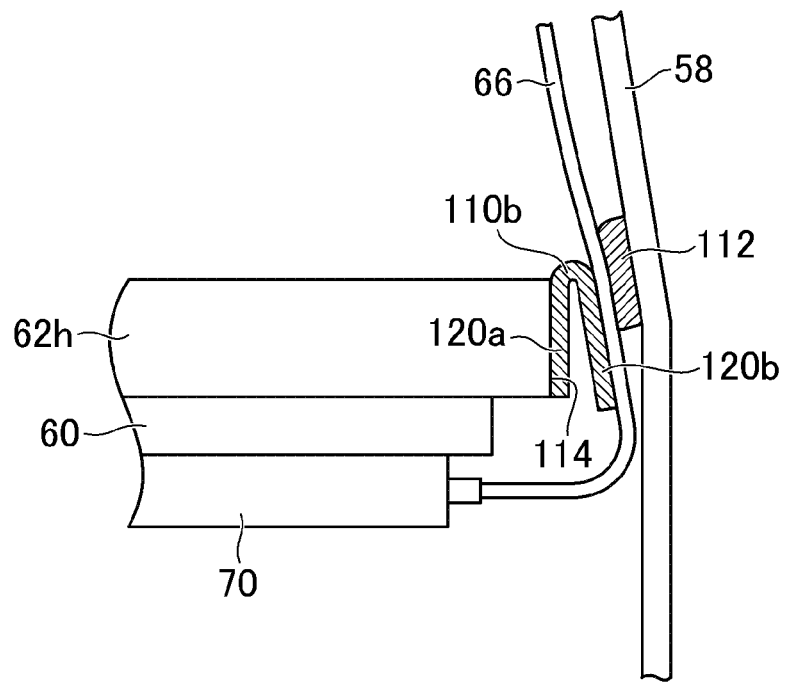
FIG. 6 is a schematic partial sectional view of the liquid crystal module, illustrating another example of the water absorbing member having a vertical sectional shape different from that of the water absorbing member in FIG. 3.

The water absorbing member 110 illustrated in FIG. 3 has a vertical sectional shape corresponding to the rear end surface 114 of the mold frame 62. FIGS. 5 and 6 are schematic views illustrating other examples of the vertical sectional shape of the water absorbing member 110, and are vertical sectional views of the liquid crystal module 52 in the vicinity of the rear end surface 114.

A water absorbing member 110a illustrated in FIG. 5 includes a part 116a adhered to the rear end surface 114 of the horizontal part 62h, and a part 116b adhered to an upper surface 118 of the horizontal part 62h so as to be continuous with the part 116a. In this structure, water absorbed by the part 116a on the rear end surface 114 through contact with the flat cable 66 is diffused to the part 116b on the upper surface 118, and hence the water absorbing capacity of the water absorbing member 110a can be increased.

A water absorbing member 110b illustrated in FIG. 6 has a vertical sectional shape in which, for example, a flat member such as non-woven fabric is folded in half. The water absorbing member 110b is adhered with the folded part directed upward, and only one part 120a of two parts 120a and 120b having the folded part as a boundary is adhered to the rear end surface 114. The other part 120b is arranged between the part 120a and the flat cable 66. Even with this structure, the water absorbing capacity can be increased.

Further, the folded part attempts to expand due to the elasticity of the material of the water absorbing member 110b. As a result, the other part 120b is easily pressed against the flat cable 66. Further, the contact area with respect to the flat cable 66 increases. Thus, the water droplets on the front surface of the flat cable 66 can be easily absorbed. Further, when the water absorbing member 110b has high elasticity, it becomes unnecessary to press the rear surface of the flat cable 66 by the counter member 112, and hence it is possible to omit the counter member 112. Further, when the counter member 112 also has the water absorbing function, it is possible to form the counter member 112 with use of a material selected while emphasizing elements other than elasticity, such as water-absorbing property, cost, and workability.

Note that, in the above-mentioned structure, lower ends of the water absorbing members 110 and 110a, lower ends of the respective parts 120a and 120b of the water absorbing member 110b, and the folded part may extend off from the width of the rear end surface 114 in the vertical direction.

Figure 7:
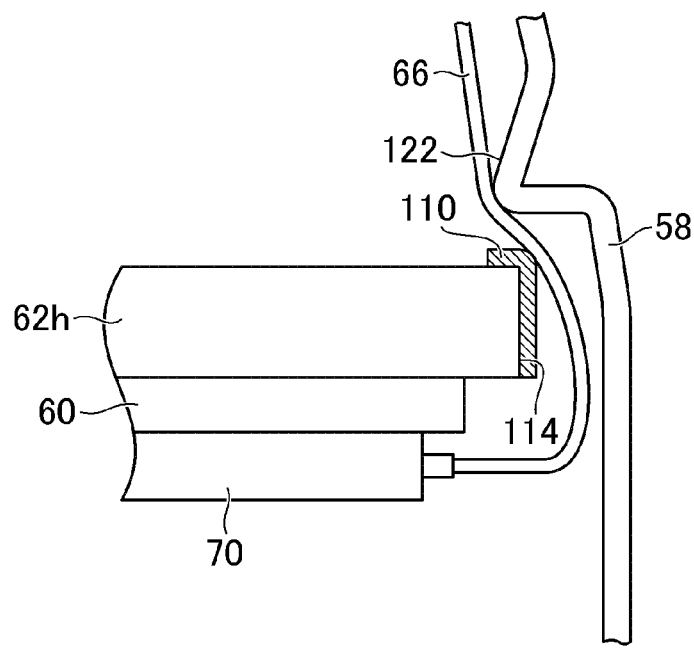
FIG. 7 is a schematic partial sectional view of the liquid crystal module, illustrating another example of a structure for pressing the flat cable against the water absorbing member.

FIG. 7 is a schematic view illustrating another example of the structure for pressing the flat cable 66 against the water absorbing member 110, and is a vertical sectional view of the liquid crystal module 52 in the vicinity of the rear end surface 114. In this structure, the inner surface of the board cover 58 has a projected portion 122 protruded forward at a position higher than the upper surface of the horizontal part 62h of the mold frame 62. With this, a vertical sectional shape of the gap in the vicinity of the rear end surface 114 is bent, and the flat cable 66 passing therethrough is pressed by the projected portion 122 against the water absorbing member 110 arranged on the rear end surface 114 side. Therefore, it becomes unnecessary to arrange the counter member 112 to obtain the pressing function. In this structure, the flexibility of the flat cable 66 is used to press the flat cable 66 toward the rear end surface 114, and hence elasticity is not required for the projected portion 122 itself. For example, the projected portion 122 can be formed by press working of the board cover 58 made of a metal.

Figure 8:
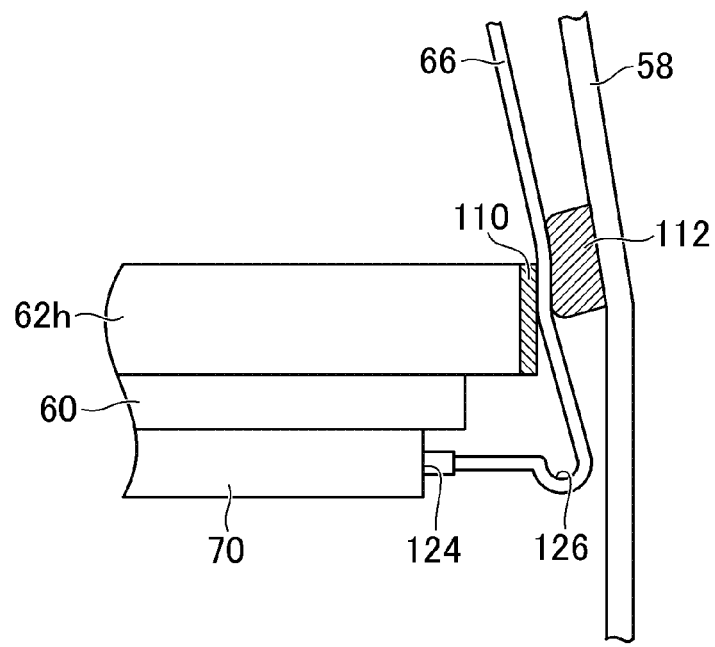
FIG. 8 is a schematic partial sectional view of the liquid crystal module, illustrating a structure in which a groove portion is provided at a bent portion of the flat cable.
Figure 9:
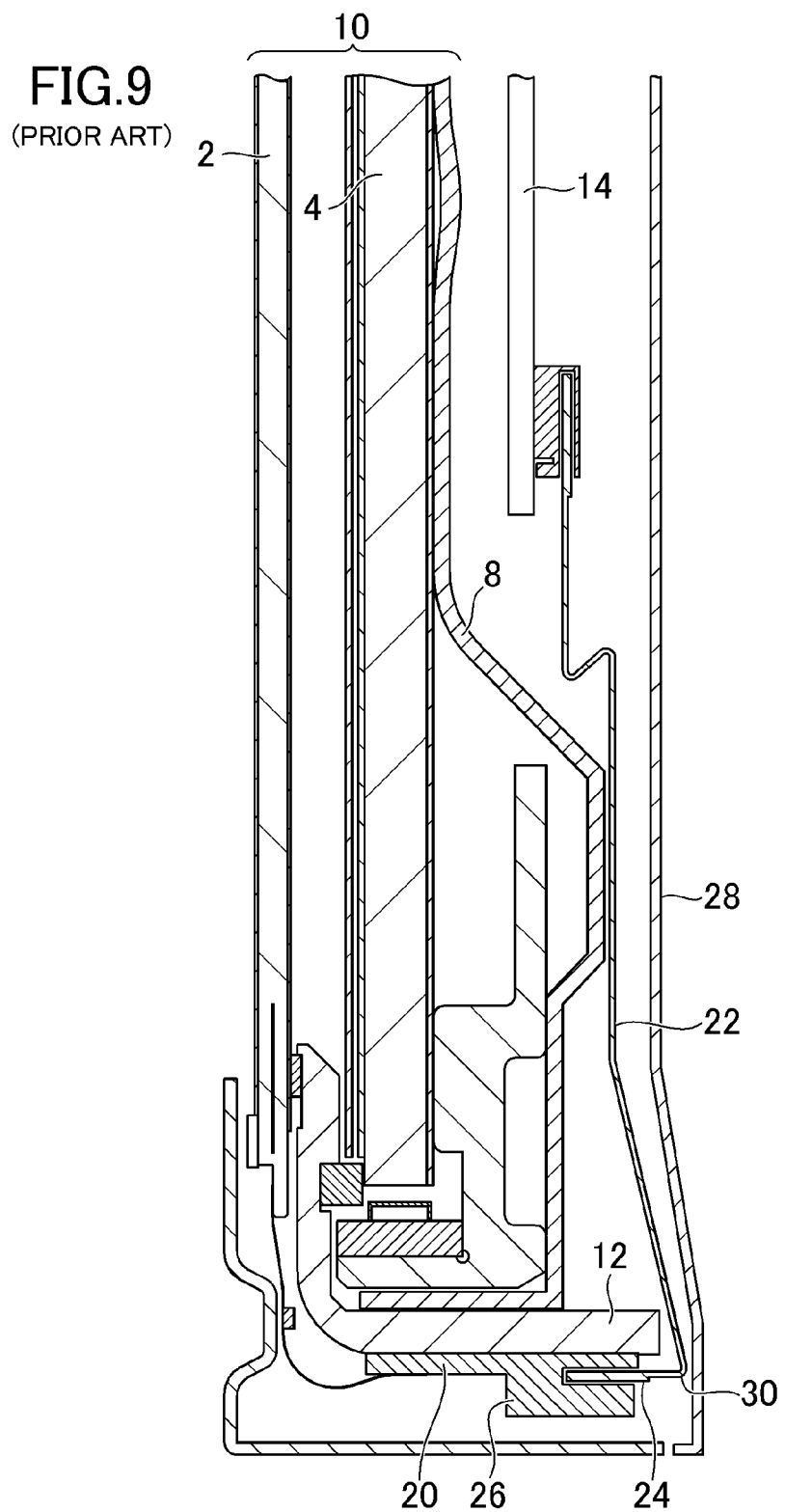
FIG. 9 is a schematic sectional view of a lower part of a conventional liquid crystal display device.

FIG. 8 is a schematic view illustrating another structure for preventing water running on the flat cable 66 from reaching the source driver board 60, and is a vertical sectional view of the liquid crystal module 52 in the vicinity of the rear end surface 114. In this structure, the bent portion 96 of the flat cable 66, which is provided between a part extending vertically toward the control circuit board 56 and a part extending horizontally toward the source driver board 60, has a groove portion 126 which is recessed below the height of an insertion port 124 of the connector 70 of the source driver board 60. When an amount of water flowing into the water absorbing member 110 exceeds the water absorbing capacity of the water absorbing member 110, water may seep from the water absorbing member 110 downwardly. In this case, with this structure, the groove portion 126 can receive the leaked water, and the water is prevented from diffusing on the surface of the horizontal part of the flat cable 66 directed to the source driver board 60. For example, the flat cable 66 covered with a thermoplastic resin can be thermoformed to preform the groove portion 126.

Further, it is preferred that the groove portion 126 be formed across the entire width of the flat cable 66. Further, it is preferred that the groove portion 126 be inclined so that the lowest point of the groove portion 126 at each position of the flat cable 66 in the width direction is monotonically lowered toward the edge of the flat cable 66 in the width direction. With this, the water collected in the groove portion 126 easily flows downward from the edge of the flat cable 66, and the water is prevented from overflowing from the groove portion 126 to the surface of the horizontal part of the flat cable 66. Thus, water is less liable to enter the source driver board 60. Note that, the groove portion 126 may be inclined in the width direction of the flat cable 66 so as to be lowered from one edge to the other edge of the flat cable 66, or to be lowered toward both sides from the vicinity of the middle portion of the width.

In the above, the display device according to the present invention has been described by means of an example of the liquid crystal display device 50 which includes the liquid crystal panel 80 as the display panel. However, the present invention is applicable to display devices using other types of display panels. That is, the display device may use, as the display panel, an organic electroluminescence (EL) panel, a plasma display panel (PDP), a field emission display (FED) panel, and the like. Further, the liquid crystal panel 80 may employ an in-plane switching (IPS) system, but driving methods other than IPS, such as a vertical alignment (VA) system and a twisted nematic (TN) system, may be employed.

Further, even when an electric cable other than the flat cable 66 is used to connect the control circuit board 56 and the source driver board 60 to each other, the present invention is applicable.

According to the present invention described above by means of the embodiment, the water absorbing member is provided to the gap between the lower edge support member and the shielding plate, through which the electric cable is passed. The water absorbing member is sandwiched between the lower edge support member and the shielding plate together with the electric cable, and is applied to the electric cable to absorb the water droplets running down on the electric cable. With this, it is possible to prevent the water droplets from reaching the second circuit board arranged on the lower surface of the lower edge support member.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A display device, comprising: a panel-like structure comprising a display panel; a lower edge support member for supporting a lower edge of the panel-like structure; a first circuit board arranged on a rear surface of the panel-like structure; a second circuit board arranged on a lower surface of the lower edge support member; an electric cable, which passes through a rear side of the lower edge support member, for connecting the first circuit board and the second circuit board to each other; a shielding plate for covering the first circuit board, the second circuit board, and the electric cable from behind; and a water absorbing member which is sandwiched between the lower edge support member and the shielding plate together with the electric cable and is applied to the electric cable; wherein the electric cable comprises a flat cable, and the water absorbing member is adhered to a rear end surface of the lower edge support member across an entire width of a part of the rear end surface opposed to the flat cable.

2. The display device according to claim 1, wherein the flat cable comprises a bent portion between a part extending vertically toward the first circuit board and a part extending horizontally toward the second circuit board, the bent portion comprising a groove portion recessed below a height of a connection portion with respect to the second circuit board.

3. The display device according to claim 2, wherein the groove portion is formed across an entire width of the flat cable, and is inclined so as to be lowered toward a side edge of the flat cable.

4. The display device according to claim 1, wherein another of the water absorbing member is adhered to the shielding plate so as to be opposed to an entire width of the flat cable.

5. The display device according to claim 1, wherein the water absorbing member comprises non-woven fabric.

* * * * *